(12) United States Patent
Tatsumi et al.

(10) Patent No.: US 9,005,461 B2
(45) Date of Patent: Apr. 14, 2015

(54) PLASMA MONITORING METHOD AND PLASMA MONITORING SYSTEM

(75) Inventors: Tomohiko Tatsumi, Miyagi (JP); Seiji Samukawa, Miyagi (JP)

(73) Assignees: Lapis Semiconductor Co., Ltd., Yokohama (JP); Tohoku University, Miyagi (JP)

( * ) Notice: Subject to any disclaimer, the term of this patent is extended or adjusted under 35 U.S.C. 154(b) by 770 days.

(21) Appl. No.: 12/219,123

(22) Filed: Jul. 16, 2008

(65) Prior Publication Data

US 2009/0058424 A1 Mar. 5, 2009

(30) Foreign Application Priority Data

Aug. 31, 2007 (JP) ................................. 2007-225677

(51) Int. Cl.
| | |
|---|---|
| *G01N 27/62* | (2006.01) |
| *B44C 1/22* | (2006.01) |
| *H01J 37/32* | (2006.01) |
| *H01L 21/66* | (2006.01) |

(52) U.S. Cl.
CPC ........... *H01J 37/32935* (2013.01); *H01L 22/14* (2013.01)

(58) Field of Classification Search
CPC ............................ H01L 22/14; H01J 37/32935
USPC ................... 216/61, 67; 156/345.28; 250/305
See application file for complete search history.

(56) References Cited

U.S. PATENT DOCUMENTS

| | | | |
|---|---|---|---|
| 2005/0115673 A1* | 6/2005 | Samukawa et al. ...... | 156/345.28 |
| 2005/0270046 A1* | 12/2005 | Blalock ......................... | 324/754 |

FOREIGN PATENT DOCUMENTS

| | | |
|---|---|---|
| JP | 8-124896 | 5/1996 |
| JP | 9-252038 | 9/1997 |
| JP | 10-228996 | 8/1998 |
| JP | 2000-311890 | 11/2000 |
| JP | 2003-282546 | 10/2003 |
| JP | 2005-236199 | 9/2005 |

* cited by examiner

*Primary Examiner* — Duy Deo
*Assistant Examiner* — Mahmoud Dahimene
(74) *Attorney, Agent, or Firm* — Rabin & Berdo, P.C.

(57) ABSTRACT

A plasma monitoring method using a sensor, the sensor having a substrate; a first electrode, the first electrode being a conductive electrode and formed on the substrate while being isolated from the substrate; an insulating film formed on the first electrode; a contact hole formed in the insulating film and having a depth from a surface of the insulating film to the first electrode; and a second electrode, the second electrode being a conductive electrode, formed on the surface of the insulating film, and faced to plasma during a plasma process, the plasma monitoring method including measuring and monitoring potentials of the first electrode and the second electrode or a potential difference between the first electrode and the second electrode during the plasma process is disclosed. A plasma monitoring system carrying out the plasma monitoring method is also disclosed.

10 Claims, 11 Drawing Sheets

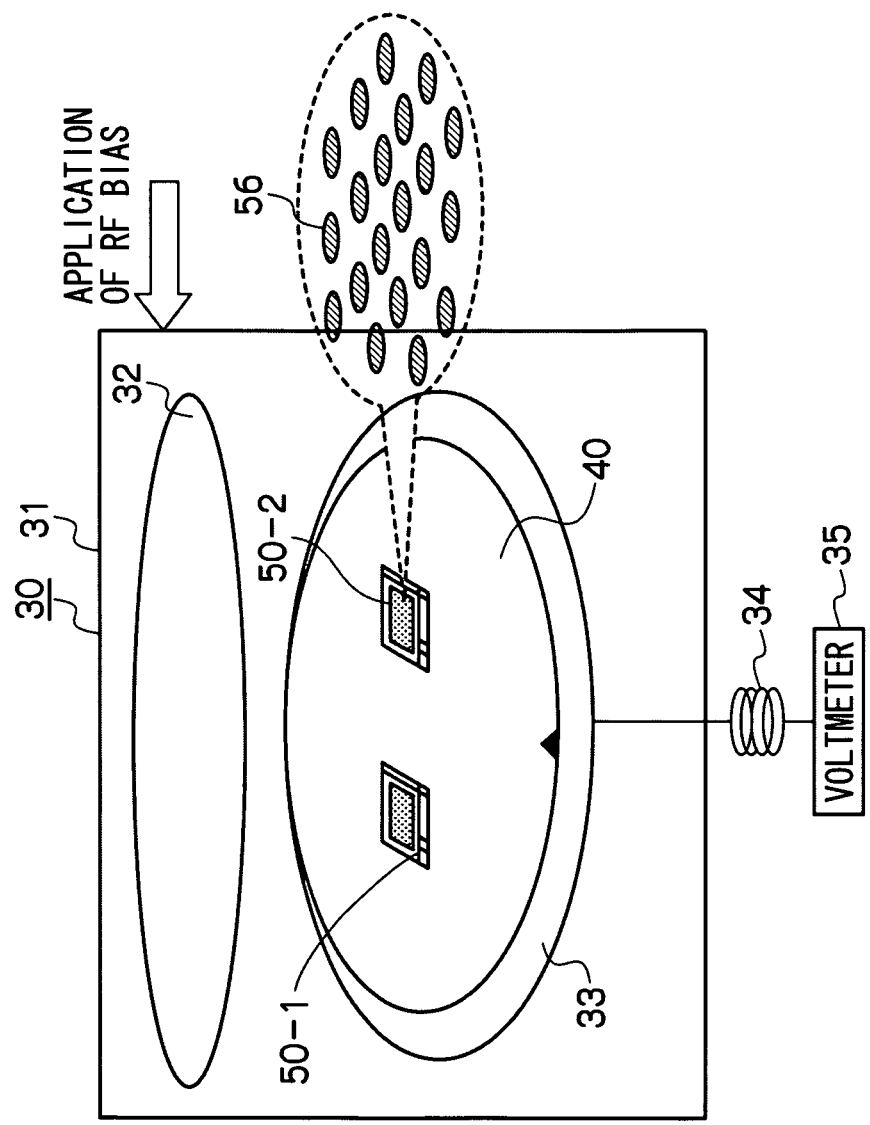

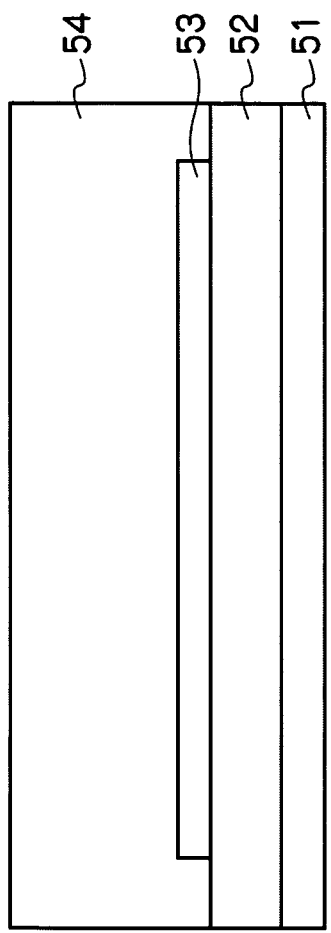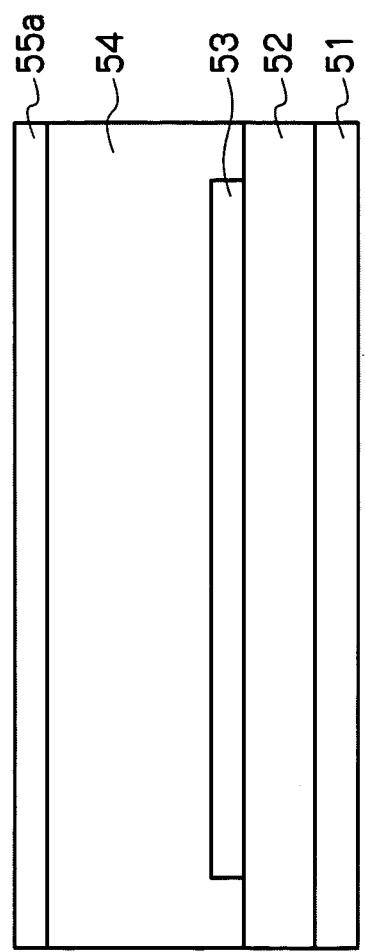
FIG. 3D
FIG. 3E

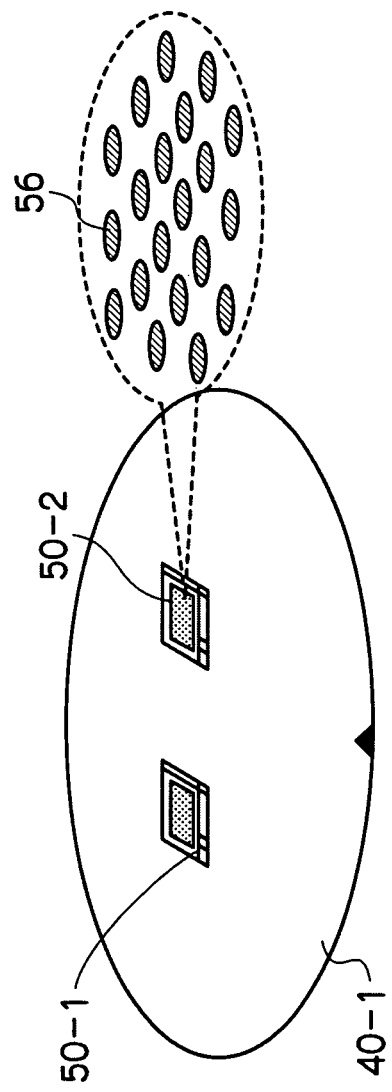
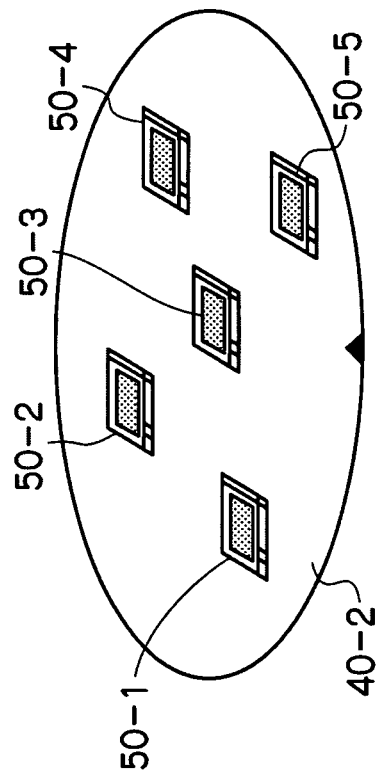

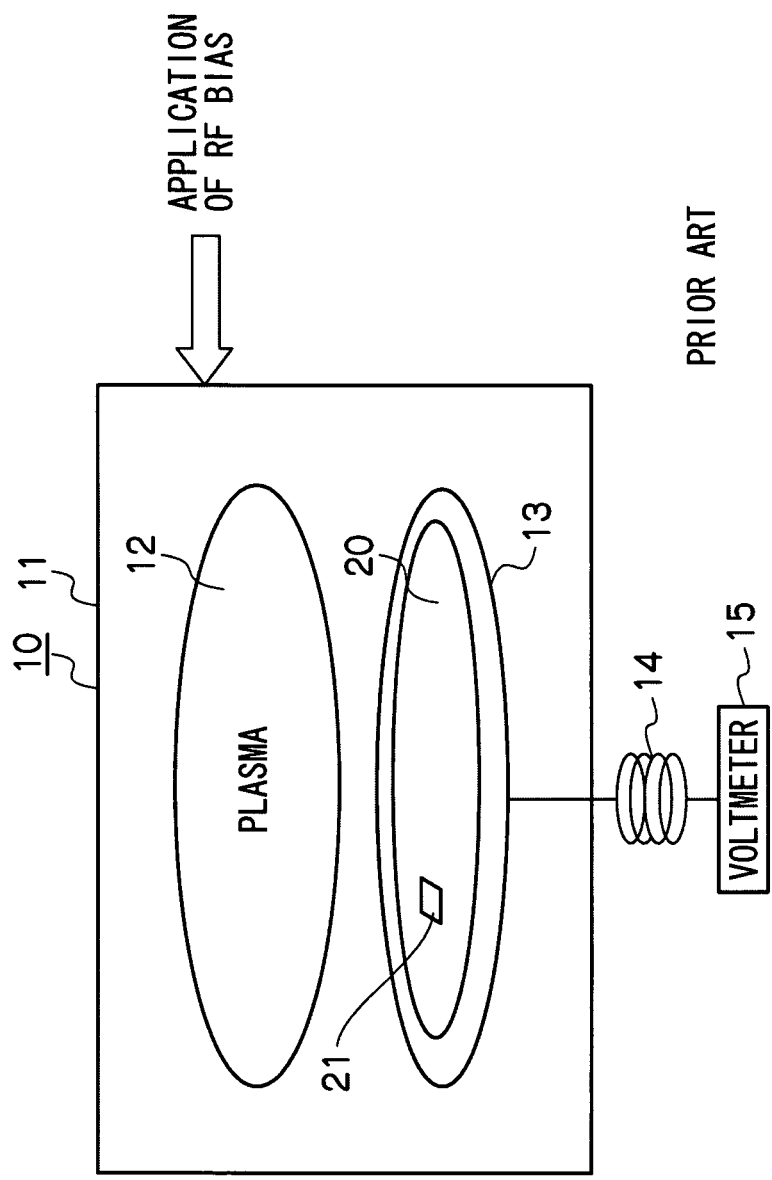

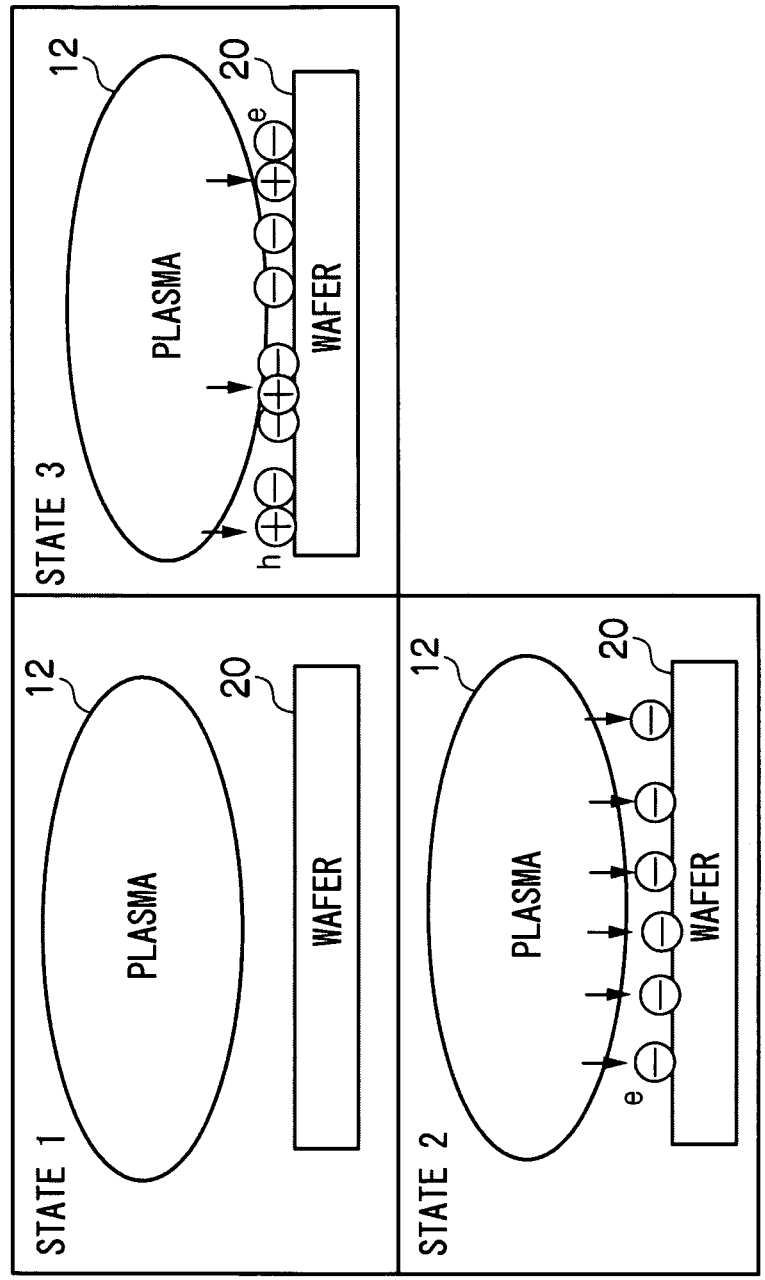

PLASMA MONITORING METHOD AND PLASMA MONITORING SYSTEM

CROSS-REFERENCE TO RELATED APPLICATION

This application claims priority under 35 USC 119 from Japanese Patent Application No. 2007-225677, the disclosure of which is incorporated by reference herein.

BACKGROUND OF THE INVENTION

1. Field of the Invention

The present invention relates to a plasma monitoring method applicable to a semiconductor manufacturing processes (steps) and all the other manufacturing processes using plasma and a plasma monitoring system therefor.

2. Description of the Related Art

There is a conventional technique related to a plasma monitoring method and a plasma monitoring system for monitoring a processing on a wafer disposed in a plasma processing apparatus as disclosed in, for example, Japanese Patent Application Laid-Open (JP-A) Nos. 2003-282546 and 2005-236199.

FIG. 7 is a schematic configuration diagram showing a conventional plasma monitoring system disclosed in the JP-A Nos. 2003-282546 and 2005-236199.

The plasma monitoring system includes a plasma processing apparatus 10. The plasma processing apparatus 10 is an apparatus applying a radio frequency (hereinafter, "RF") bias to a plasma chamber 11 set in a vacuum to generate plasma 12 within the plasma chamber 11, and performing such processings as etching and film formation on a wafer 20 that is a monitoring target workpiece disposed on a stage 13. A voltmeter 15 for self-alignment bias measurement is connected to the stage 13 via a coil 14 for alternating current (hereinafter, "AC") voltage component elimination. A sensor 21 or the like for plasma process detection is bonded onto the wafer 20.

If a plasma process is to be monitored, then the plasma 12 is generated in the plasma chamber 11 by application of the RF bias to the plasma chamber 11, and the plasma process (e.g., plasma etching) is performed on the wafer 20. At this time, by monitoring a voltage detected by the sensor 21, a plasma etching end point may be detected and the wafer 20 may be worked with high accuracy.

It is generally known that energy of ions generated from the plasma 12 during the plasma etching influences a shape and a size of a pattern of the wafer 20 and electrically damages the wafer 20. Due to this, it is important to observe energy of ions incident on the wafer 20 from the plasma 12 and an ion energy distribution. However, since the ion incident energy if ions may not be directly measured, a self-alignment bias is monitored and set as an indirect index. Normally, the voltmeter 15 disposed below the stage 13 within the plasma chamber 11 measures an average value of the self-alignment bias. Since the self-alignment bias is an AC voltage, the coil 14 eliminates RF component in the AC voltage so that the voltmeter 15 may measure only a constant direct-current (hereinafter, "DC") voltage.

FIG. 8 is a schematic diagram explaining the self-alignment bias. As shown in a state 1, when the wafer 20 is exposed to the plasma 12, the plasma 12 is in a state in which electrons e and positive ions h are slightly separated. Both the electrons e and the positive ions h move to be charged onto the wafer 20. However, at this time, the electrons e more faster and a large quantity of electrons e are charged onto the wafer 20 (and onto the stage 13 if the stage 13 is present under the wafer 20) since the electrons e are far lighter than the positive ions h. Due to this, as shown in a state 2, a potential of the wafer 20 turns negative by the charging of the electrons e on the wafer 20.

As shown in a state 3, the positive ions h which are oppositely charged to electrons e, and which move faster than electrons, arrive at the wafer 20. However, the amount of the positive ions h is not so large as to cancel the electrons e previously charged at the wafer 20. Due to this, ultimately both the negative electrons e and the positive ions h from the plasma 12 arrive at the wafer 20 and are charged thereat. However, since a charge amount of the initial negative electrons e (in the state 1) is larger, the potential of the wafer 20 is negative in a stable state. This negative potential is referred to as self-alignment bias.

Nevertheless, the conventional plasma monitoring methods and plasma monitoring systems have a first problem (1) and a second problem (2) as follows.

(1) First Problem

In a working process of forming a large scale integrated circuit (hereinafter, "LSI") on the wafer 20, plural contact holes is formed, for example, by plasma etching. However, both a potential of a surface of the wafer 20 and that of a bottom of each contact hole may not be monitored in the conventional technique. Due to this, charge offset caused by trapping of charges (charge-up) may not be measured. If an aspect ratio (a ratio of a depth of each contact hole to a diameter thereof) is high, it is difficult for the electrons e to arrive at bottoms of the contact holes (electron blocking effect). As a result, the electrons e are insufficiently supplied to the bottoms of the contact holes, thereby making the bottoms of the contact holes positively charged up as compared with a surface of a contact hole pattern. These respects provoke such problems as dielectric breakdown of transistors, reduction in etch rate, and insufficient progress of etching. The charge-up problem is serious since the diameter of each contact hole in and after the advanced 65-nanometer (nm) generation is 0.1 micrometer (μm) and the aspect ratio of the contact hole is as high as about 10.

Generally, a recording memory transistor (Non-Volatile Memory Transistors (hereinafter "NVM")) or a wafer (blank wafer), on which no circuit pattern is formed, is employed to monitor a charge-up amount. However, even with use of the NVM or the blank wafer, neither the measurement of a charge-up amount on an actual pattern nor that of a charge-up amount at real time may not be advantageously made. A problem related to the NVM (hereinafter, "(a) NVM-related Problem") and a problem related to the blank wafer (hereinafter, "(b) blank wafer-related Problem") will be described in detail.

(a) NVM-Related Problem

In case of the NVM, an antenna (a conductor) on the surface of a wafer 20 exposed to the plasma 12 is connected to a gate electrode of the NVM buried in the wafer 20. A transistor characteristics (easiness of current flow between a source electrode and a drain electrode) of the NVM changes according to a magnitude of a potential applied to the gate electrode of the NVM. Due to this, if charge-up occurs on the NVM charge-up monitoring wafer 20, charges are trapped into the antenna and a potential of the antenna changes. Since the antenna is connected to the gate electrode of the NVM, the characteristic of the NVM changes according to a potential of the antenna. Namely, an amount of a change in the transistor characteristics may be recognized from a magnitude of a charge-up amount (a potential change width). Therefore, if the charge-up occurs on the NVM charge-up monitoring wafer 20, then charges are trapped into the antenna and the antenna potential changes. Since the antenna is connected to the gate electrode of each NVM, the NVM characteristic changes according to the magnitude of the antenna potential. Namely, the magnitude of the charge-up amount (potential change width) may be confirmed from the change amount of the transistor characteristics. Accordingly, in case of the NVM, the sensor wafer 20 that is the monitoring target workpiece is temporarily exposed to the plasma 12 to change the NVM characteristic, the sensor wafer is taken out from the plasma 12, and how much the NVM characteristic changes (a change amount of the easiness for current flow across the NVM) before and after the exposure to the plasma 12 is measured using a measuring instrument.

Therefore, if the charge-up occurs in the atmosphere of the plasma 12, the charge-up (e.g., antenna potential) may not be observed at real time. Further, since the antenna (conductor) is flat and the flat antenna (conductor) receives (picks up) the charge-up, the charge-up that occurs in a pattern of an actual LSI product such as contact hole may not be measured.

(b) Blank Wafer-Related Problem

The blank wafer means a wafer configured so that only a silicon oxide film or a silicon nitride film is formed simply on one surface of a silicon substrate. If the wafer 20 having such an insulating film formed on the silicon substrate is exposed to the plasma 12, a surface of the insulating film is charged up. Next, when the wafer 20 is taken out from the plasma chamber 11, charges trapped onto the insulating film remain (as a charge-up residue). This charge-up residue is measured using a noncontact potential measuring instrument to thereby measure a charge-up degree. As can be seen, if the blank wafer is used, the measurement is made after the sensor wafer 20 is taken out from the atmosphere of the plasma 12 and not made when charge-up actually occurs in the atmosphere of the plasma 12. Therefore, the charge-up may not be measured at real time. Besides, since the insulating film is a plain film without a pattern on the silicon substrate, the charge-up may not be measured in an actual pattern including contact holes.

(2) Second Problem

Since the energy of ions incident on the wafer 20 from the plasma 12 may not be directly measured, the self-alignment bias is monitored and used as an indirect index. Normally, the average value of the self-alignment bias is measured by the voltmeter 15 disposed below the stage 13. Due to this, an in-plane distribution of the self-alignment bias may not be measured. This second problem will be described in detail.

As shown in FIG. 7, normally, the stage 13 is a conductive electrode. If the self-alignment bias is generated in the atmosphere of the plasma 2, the self-alignment bias is applied to portions (such as an outer circumference) of the stage 13 to which portions the plasma 12 is exposed. The voltmeter 15 is disposed below and connected to the stage 13, and measures the self-alignment bias. Due to this, the self-alignment bias is measured while using an entire area of the portions (e.g., the outer circumference) of the stage 13 to which portions the plasma is exposed as an antenna. As a result, how the self-alignment bias differs among plural points on the wafer 20 (on the stage 13) and the like may not be measured. In FIG. 7, the average value of the self-alignment bias with the outer circumference of the stage 13 set as an antenna (i.e., the average value of each self-alignment biases that possibly slightly differ among various points on the outer circumference of the stage 13) is measured.

SUMMARY OF THE INVENTION

According to a first aspect of the present invention, there is provided a plasma monitoring method using a sensor, the sensor comprising:

a substrate;

a first electrode, the first electrode being a conductive electrode and formed on the substrate and electrically isolated from the substrate;

an insulating film formed on the first electrode;

a contact hole formed in the insulating film and having a depth from a surface of the insulating film to the first electrode; and a second electrode, the second electrode being a conductive electrode, formed on the surface of the insulating film, and facing a plasma during a plasma process, the plasma monitoring method comprising:

measuring and monitoring potentials of the first electrode and the second electrode or a potential difference between the first electrode and the second electrode during the plasma process.

According to a second aspect of the invention, there is provided a plasma monitoring system comprising:

a sensor having a substrate; a first electrode, the first electrode being a conductive electrode and formed on the substrate and electrically isolated from the substrate; an insulating film formed on the first electrode; a contact hole formed in the insulating film and having a depth from a surface of the insulating film to the first electrode; and a second electrode, the second electrode being a conductive electrode, formed on the surface of the insulating film, and facing a plasma during a plasma process; and a voltmeter measuring potentials of the first electrode and the second electrode or a potential difference between the first electrode and the second electrode during the plasma process.

BRIEF DESCRIPTION OF THE DRAWINGS

FIG. 2 is a schematic configuration diagram of the plasma monitoring system according to Example 1 of the invention;

FIGS. 3A to 3I are schematic cross-sectional step views showing each one of the steps of an exemplary method of manufacturing the plasma process detection sensor shown in FIG. 1;

FIGS. 5A and 5B are schematic configuration diagrams of a plasma monitoring system 50A according to Example 2 of the invention;

FIG. 7 is a schematic configuration diagram of a conventional plasma monitoring system; and FIG. 8 is a schematic diagram explaining the self-alignment bias.

DETAILED DESCRIPTION OF THE INVENTION

Example 1

Figure 1:
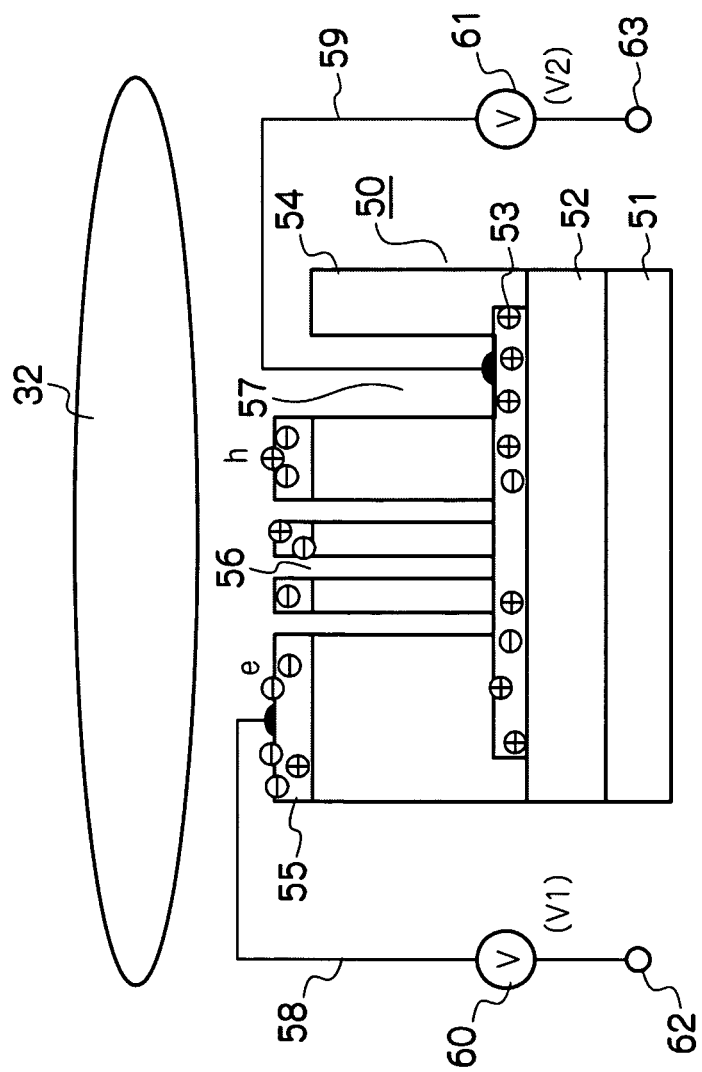
FIG. 1 is a schematic cross-sectional view of a plasma process detection sensor included in a plasma monitoring system according to Example 1 of the present invention.
Figure 3A:
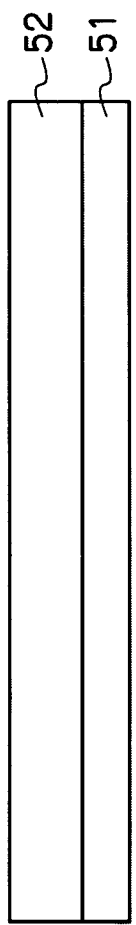
Figure 3B:
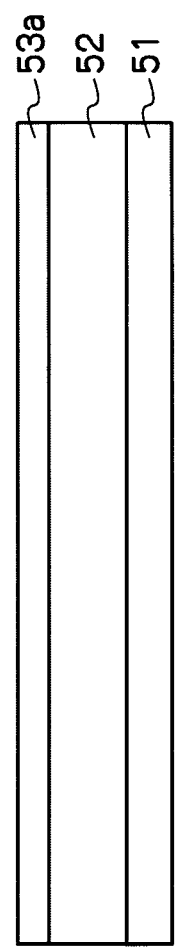
Figure 3C:
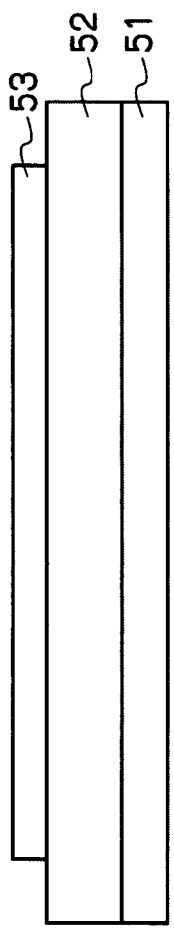
Figure 3F:
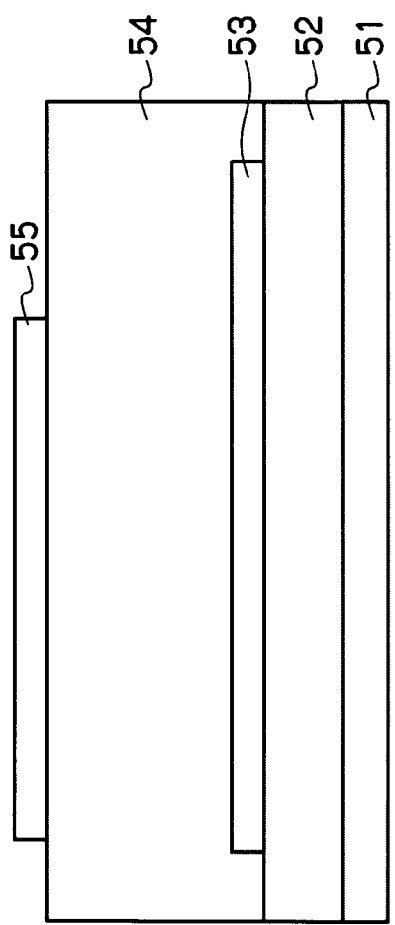
Figure 3G:
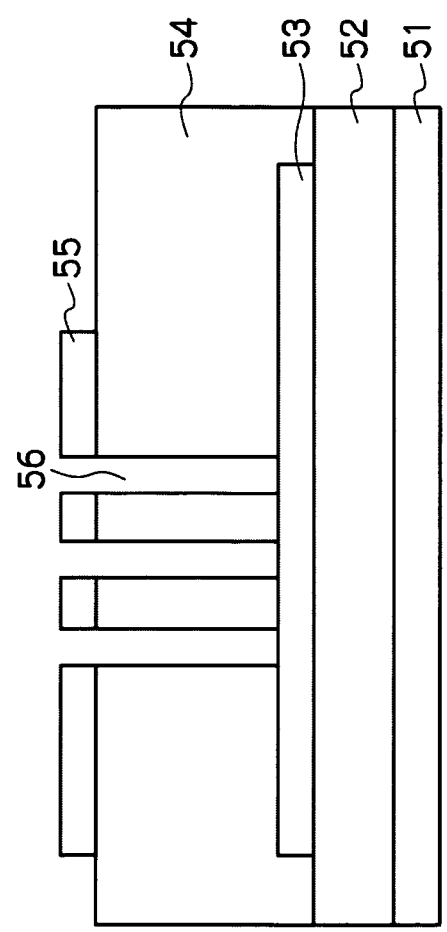
Figure 3H:
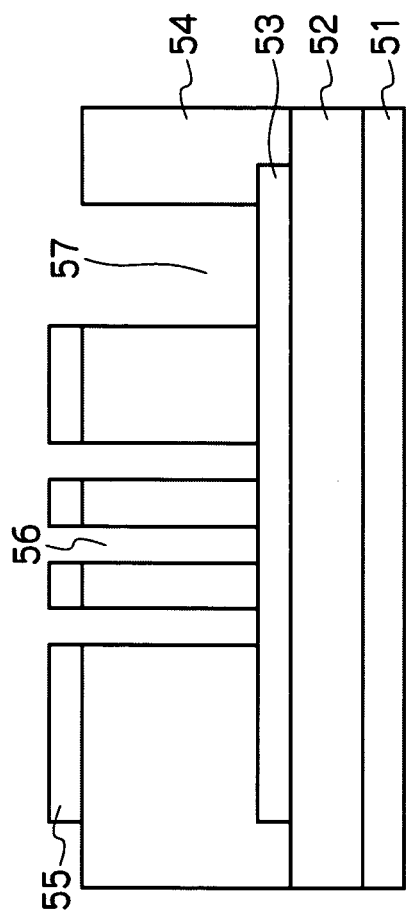
Figure 3I:
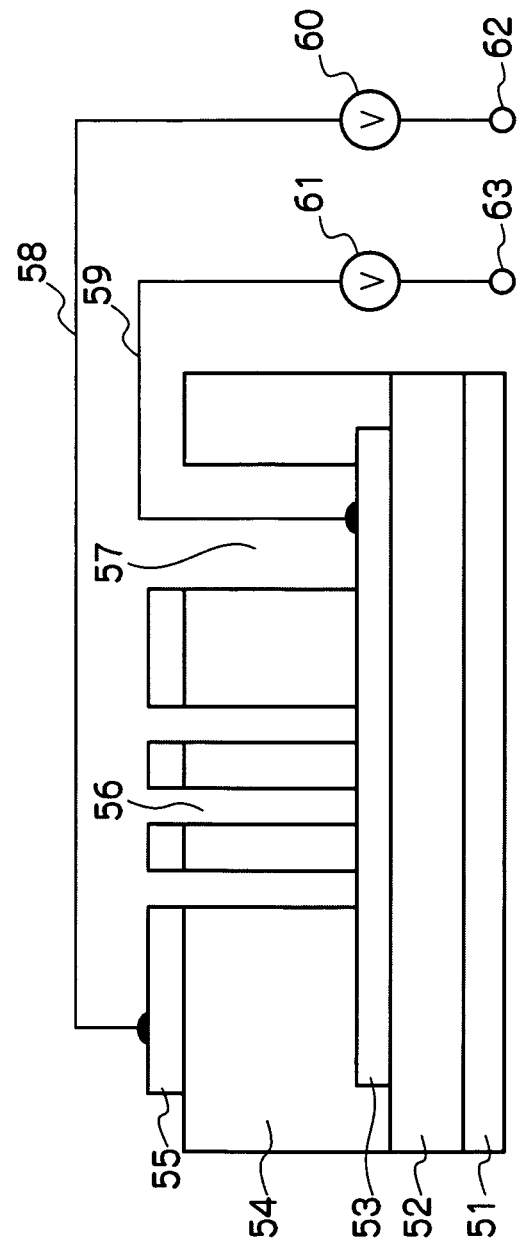

Plasma Monitoring System According to Example 1

FIG. 2 is a schematic configuration diagram of a plasma monitoring system according to Example 1 of the present invention.

The plasma monitoring system includes a plasma processing apparatus 30. The plasma processing apparatus 30 is an apparatus that generates plasma 32 within a plasma chamber 31 set in a vacuum by applying an RF bias to the plasma chamber 31. The plasma processing apparatus 30 performs such processings as etching and film formation on a wafer 40 such as a semiconductor wafer, e.g., a silicon wafer disposed on a conductive stage 33 and serving as a monitoring target workpiece. A voltmeter 35 for self-alignment bias measurement is connected to the stage 33 via a coil 34 for AC voltage component elimination. Two plasma process detection sensors 50 (50-1, 50-2) are bonded onto a predetermined portion or plural different portions (bonded onto two portions in FIG. 2, respectively) on a surface of the wafer 40.

FIG. 1 is a schematic cross-sectional view of each of the plasma process detection sensors 50 shown in FIG. 2 according to Example 1 of the invention.

This plasma process detection sensor 50 has a substrate (e.g., silicon substrate) 51 and an insulating film 52 having a thickness of about 1.0 μm, made of silicon oxide (SiO2 film), and formed on the silicon substrate 51. A first electrode (e.g., lower electrode) 53 having a thickness of about 300 nm and made of a conductive matter such as polysilicon (Poly-Si) is selectively formed on the insulating film 52. An insulating film 54 having a thickness of about 1.0 μm and made of silicon oxide is deposited on the first electrode 53. A second electrode (e.g., an upper electrode) 55 having a thickness of about 300 nm and made of a conductive material such as polysilicon is selectively formed on the insulating film 54. A contact hole pattern for plural contact holes 56 to be actually formed in the wafer 44 and each having a circular cross section is formed on the upper electrode 55. A diameter of the circular cross section of each of the contact holes 56 is about 100 nm. The contact hole 56 has a depth of about 1.3 μm measured from a surface of the upper electrode 55 to a surface of the lower electrode 53.

A wiring connection area 57 is opened in an exposed portion of the surface of the insulating film 54 and the surface of the lower electrode 53 is exposed from the wiring connection area 57. A wiring 58 is connected to the upper electrode 55 and a wiring 59 is connected to the lower electrode 53, and the two wirings 58 and 59 are led outside of the plasma chamber 31 shown in FIG. 2 via terminals (not shown), respectively. A voltmeter 60 for measuring potential is connected to the wiring 58 led outside. The voltmeter 60 is connected to a terminal 62 having a reference potential (e.g., ground potential). Similarly, a voltmeter 61 measuring potential is connected to another wiring 59. The voltmeter 61 is connected to a terminal 63 having a reference potential (e.g., ground potential).

Method of Manufacturing the Sensor According to Example 1

FIGS. 3A to 3I are schematic cross-sectional views showing each one of the steps of a method of manufacturing each of the sensors 50 shown in FIG. 1. The sensor 50 shown in FIG. 1 is, for example, manufactured by the following steps (FIGS. 3A to 3I).

In an insulating film formation step (FIG. 3A), the insulating film 52 having the thickness of about 1.0 μm and made of silicon oxide is formed on the silicon substrate 51 by thermal oxidation. In a conductive film formation step (FIG. 3B), a conductive film 53a having a predetermined impurity ion concentration, having a thickness of about 300 nm, and made of polysilicon is formed on the insulating film 52 by a chemical vapor deposition (hereinafter, "CVD") method. In an electrode formation step (FIG. 3C), a mask for an electrode pattern which is made of a resist film is formed on the conductive film 53a by photolithography. The conductive film 53a is then etched by dry etching such as plasma etching to form the lower electrode 53, and the unnecessary mask is removed by ashing.

In an insulating film formation step (FIG. 3D), the insulating film 54 having the thickness of about 1.0 μm and made of silicon oxide is deposited by the CVD method. In a conductive film formation step (FIG. 3E), similarly to the conductive film formation step (FIG. 3B), a conductive film 55a having a predetermined impurity ion concentration, having the thickness of about 300 nm, and made of polysilicon is formed on the insulating film 54 by the CVD method. In an electrode formation step (FIG. 3F), similarly to the electrode formation step (FIG. 3C), a mask for an electrode pattern made of a resist film is formed on the conductive film 55a by the photolithography, and the conductive film 55a is etched by the dry etching such as plasma etching to form the upper electrode 55.

In a contact hole formation step (FIG. 3G), a resist pattern is formed on the upper electrode 55 by the photolithography, and the upper electrode 55 and the insulating film 54 are etched by a depth up to the surface of the lower electrode 53 using the resist pattern as a mask by the dry etching such as plasma etching, thereby forming the contact hole pattern of plural contact holes 56 each having a circular cross section. The diameter of a circular cross section of each contact hole 56 is about 100 nm and the depth of the contact hole 56 is about 1.3 μm. In a wiring connection area opening step (FIG. 3H), the insulating film 54 is etched from the exposed surface to the surface of the lower electrode 53 by the photolithography and by the dry etching to open the wiring connection area 57.

Thereafter, in a wiring connection step (FIG. 3I), the wirings 58 and 59 are connected to the upper electrode 55 and the lower electrode 53 and to the voltmeters 60 and 61 provided outside of the plasma chamber 31 shown in FIG. 2, respectively.

Plasma Monitoring Method According to Example 1

Plural (e.g., two) sensors 50 each having the actual contact hole pattern manufactured as stated above is prepared. The two sensors 50 (50-1, 50-2) are bonded onto the two different portions on the surface of the wafer 40 shown in FIG. 2, respectively, and the resultant sensor-added wafer 40 is mounted on the stage 33 within the plasma chamber 31 in the plasma processing apparatus 30. An internal pressure of the plasma chamber 31 is set to, for example, 120 mTorr. A mixture gas of CHF3, CF4, N2, and Ar is filled into the plasma chamber 31 as a filler gas. The RF bias at 1600 W is applied to the plasma processing apparatus 30. Here, the plasma 32 is generated in the plasma chamber 31, and the wafer 40 is exposed to the plasma 32.

If the wafer 40 is exposed to the plasma 32, charge-up occurs at the bottoms of each of the contact holes 56 in the respective sensors 50 (50-1 and 50-2) due to an electron blocking effect (electron shading effect) as shown in FIG. 1. Namely, more electrons e are trapped at the upper electrode 55 than at the lower electrode 53, thereby causing a charge bias between the surface of the contact hole pattern and the bottoms of each of the contact holes 56. Due to this, the upper electrode 55 and the lower electrode 53 have different potentials. At this time, one or both of the upper electrode 55 and the lower electrode 53 is measured by the voltmeters 60 and 61, respectively or a potential difference Δ(V2−V1, where V1 is a value indicated by the voltmeter 60 and V2 is a value indicated by the voltmeter 61) between the upper electrode 55 and the lower electrode 53 is measured by the voltmeters 60 and 61, and monitored.

At this time, if a self-alignment bias Vdc is generated in the atmosphere of the plasma 32, the self-alignment bias Vdc is applied to the portions (such as the outer circumference) of the conductive stage 33 which portions are exposed to the plasma 32. Since the voltmeter 35 is disposed below the stage 33 and connected to the stage 33, the self-alignment bias Vdc is read by the voltmeter 35. In this way, the self-alignment bias Vdc is measured with the entire area of the plasma-exposed portions of the stage 33 (such as the outer circumference of the stage 33) used as an antenna.

Advantages of Example 1

Figure 4:
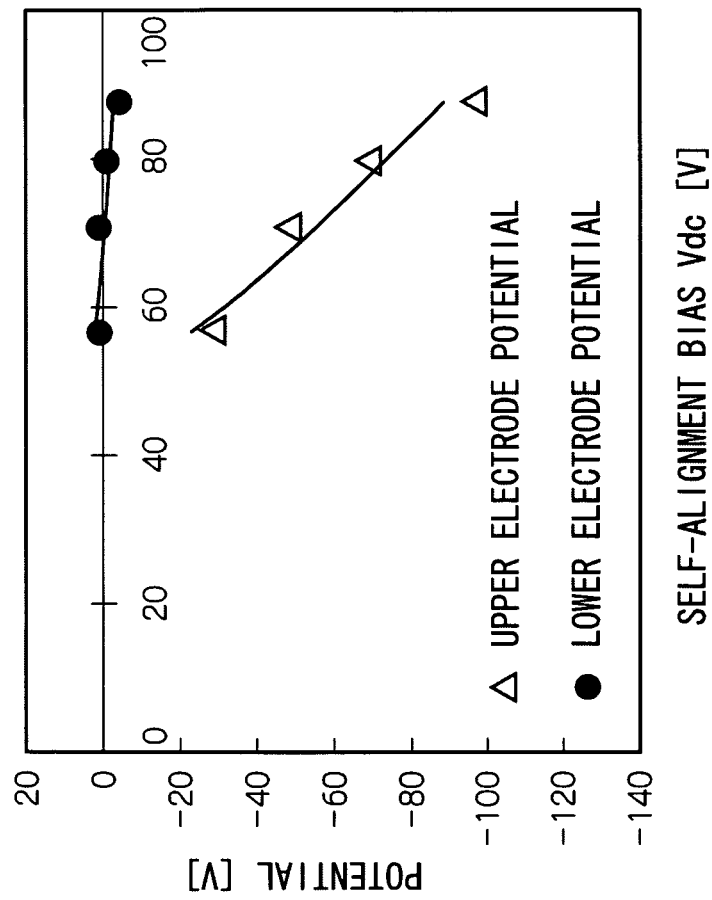
FIG. 4 is a chart of experimental data showing dependence of a potential of an upper electrode 55 and a potential of a lower electrode 53 shown in FIG. 1 on a self-alignment bias.

FIG. 4 is a chart of experimental data showing the dependence of the potentials of the upper electrode 55 and the lower electrode 53 shown in FIG. 1 on the self-alignment bias. In FIG. 4, the horizontal axis indicates the self-alignment bias Vdc (V) and the vertical axis indicates the potentials (V) of the upper electrode 55 and the lower electrode 53.

According to Example 1, in each of the sensors 50 (50-1, 50-2), the upper electrode 55 and the lower electrode 53 are provided on the surface of the actual contact hole pattern and the bottoms of the contact holes 56, and the potentials of the surface of the contact hole pattern and the bottoms of the contact holes 56 are measured simultaneously using the voltmeters 60 and 61. Due to this, as can be understood from the experimental data shown in FIG. 4, the charge-up occurring in the actual contact pattern may be observed as the potential difference between the upper electrode 55 and the lower electrode 53. Besides, since the potential difference is measured during occurrence of the plasma 32, the charge-up may be observed at real time. Therefore, process conditions may be optimized and a reduction in yield caused by the charge-up may be prevented.

Furthermore, as can be understood from the experimental data shown in FIG. 4, the potential of the upper electrode 55 has a correlation with the self-alignment bias Vdc measured by the voltmeter 35 shown in FIG. 2. Since the sensors 50-1 and 50-2 are arranged in plural different portions (e.g., two portions) in the plane of the wafer 40, respectively, the in-plane distribution of the self-alignment bias Vdc may be monitored indirectly. To improve monitoring accuracy, it suffices to increase the number of sensors 50 installed in the plasma processing apparatus 30.

Example 2

Configuration of Plasma Monitoring System According to Example 2

FIGS. 5A and 5B are schematic configuration diagrams of a plasma monitoring system according to Example 2 of the invention. In FIGS. 5A and 5B, the same constituent elements as those shown in FIGS. 1 and 2 according to Example 1 are denoted by the same reference symbols, respectively.

The sensors 50 (=50-1 to 50-5) described in Example 1 are bonded onto each of plural (e.g., two) wafers 40-1 and 40-2. At this time, the sensor-added wafers 50-1 and 50-2 are configured so as to differ to each other in the total area of contact holes 56 in the sensors 50 on the wafer 40-1 and 40-2, which is defined as (area of cross-sectional circle of one contact hole 56)×(number of contact holes 56 on the wafer 40-1 and 40-2). For example, in FIGS. 5A and 5B, the number of sensors 50 arranged on the wafers 40-1 and 40-2 are different. In FIG. 5A, the two sensors 50-1 and 50-2 are arranged in the plane of the wafer 40-1. In FIG. 5B, the five sensors 50-1 to 50-5 are arranged in the plane of the wafer 40-2. By such arrangement, the total area of the contact holes 56 in the sensors 50-1 to 50-5 arranged on the wafer 40-2 is 2.5 times as large as that of the contact holes 56 in the sensors 50-1 and 50-2 arranged on the wafer 40-1.

(Plasma Monitoring Method According to Example 2)

The two wafers 40-1 and 40-2, in which the sensors 50 are arranged, are exposed to the plasma 32 in the same conditions. Namely, the first sensor-added wafer 40-1 is disposed within the plasma chamber 31, exposed to the plasma 32 in certain conditions, and taken out from the plasma chamber 31. The second sensor-added wafer 40-2 is then disposed within the plasma chamber 31 and exposed to the plasma 32 in the same conditions as those for the first wafer 40-1.

As a result of the exposure of the wafer 40-2 to the plasma 32, charge-up occurs on the bottoms of the contact holes 56 of the sensors 50 by the electron blocking effect (electron shading effect). Due to this, the upper electrode 55 and the lower electrode 53 of each of the sensors 50 have different potentials. At this time, the potential difference between the upper electrode 55 and the lower electrode 53 of each of the sensors 50 arranged on the each of the wafers 40-1 and 40-2 is measured by the voltmeters 60 and 61, and monitored.

Examples of a method of measuring the potential difference between the upper electrode 55 and the lower electrode 53 of a single sensor 50 are as follows. In a first method, the voltmeters 60 and 61 are connected to a single sensor 50 and measure the potentials, respectively. The potentials measured by the voltmeters 60 and 61 are compared with each other (the potential difference is calculated). In a second method, one voltmeter (having two terminals for measuring potentials of two electrodes) is connected to the two electrodes, i.e., the upper electrode 55 and the lower electrode 53 of the single sensor 50, and the voltage (potential difference) between the two electrodes is directly measured. As can be seen, it is necessary to use two voltmeters per sensor to measure potentials using the voltmeters according to the first method. It is necessary to use a single voltmeter per sensor to measure potentials using the voltmeter according to the second method. Either of the first and second methods may be adopted.

Advantages of Example 2

According to Example 2, by comparing the potential differences measured with respect to the sensor-added wafers 40-1 and 40-2, where the respective contact holes 56 of the sensors 50 arranged respectively on the wafers have different total areas, the dependence of the charge-up on the pattern ratio (dependence of the charge-up on the total area of the contact holes 56 per wafer) may be observed.

Namely, if a plasma etching target area is larger, the amount of plasma gas consumed for the plasma etching is normally larger (because of a large amount of reaction gas reacting with the etching target workpiece). In this case, if the supply amount of the plasma gas relative to the consumption amount is insufficient, plasma etch rate decelerates. The deceleration of the etch rate due to an increase in the consumption amount relative to the supply amount of the plasma gas is referred to as "loading effect". The loading effect is confirmed by measuring the dependence of the etch rate on the pattern ratio (dependence of the etch rate on the etching target area).

Similarly to Example 1, according to Example 2, it is considered that the insulating film and the like on inner sidewalls of the contact holes 56 in the sensors 50 are slightly etched. Due to this, if the area of the contact holes 56 present in the wafers 40-1 and 40-2 is larger (e.g., the number of contact holes 56 is larger or the diameter of each contact hole 56 is larger), the amount of gas reacting with the insulating film and the like on the sidewalls of the contact holes 56 is larger (i.e., the amount of gas consumed in the contact holes 56 out of the plasma 32 within the plasma chamber 31 increases). As a result, the state of the plasma 32 ("plasma state") within the plasma chamber 31 changes. It is considered, therefore, that charge-up change deriving from the change in the plasma 32 occurs. By observing the dependence of the charge-up on the pattern ratio, therefore, the plasma state may be appropriately monitored.

Example 3

Figure 6:
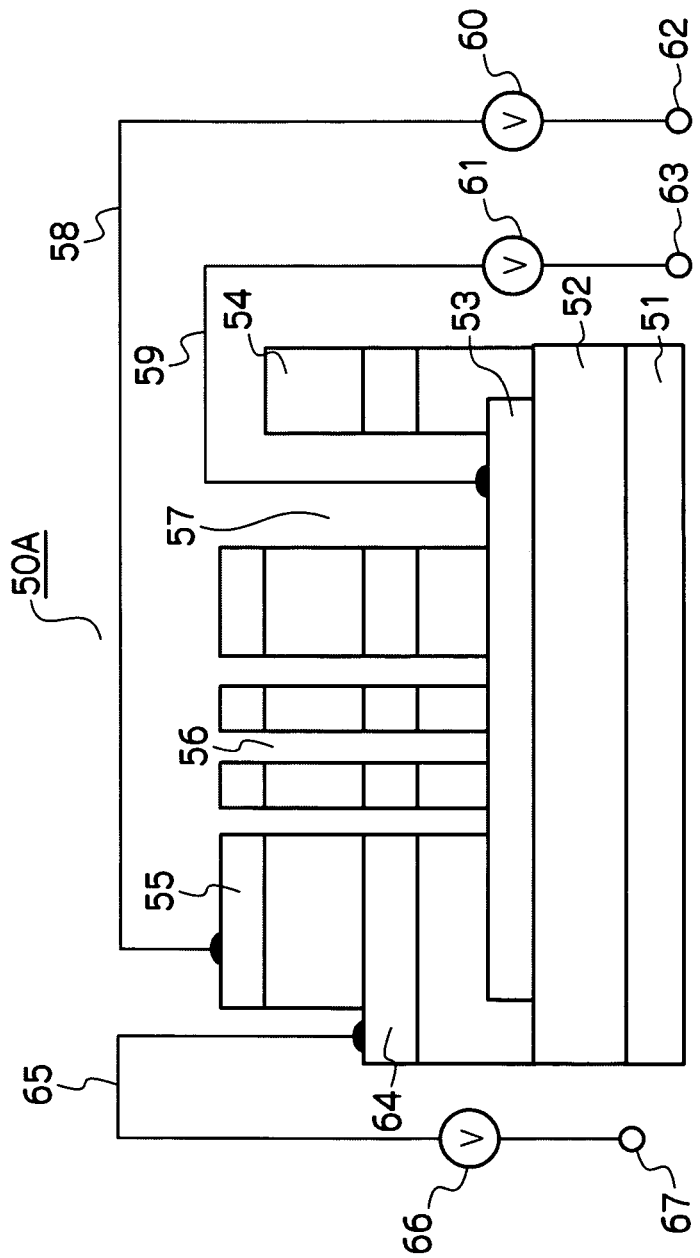
FIG. 6 is a schematic cross-sectional view of a plasma process detection sensor according to Example 3 of the invention.

FIG. 6 is a schematic cross-sectional view of a plasma process detection sensor 50A according to Example 3 of the invention. In FIG. 6, the same constituent elements as those shown in FIG. 1 according to Example 1 are denoted by the same reference symbols, respectively.

One or more intermediate electrodes may be provided between the upper electrode 55 and the lower electrode 53 in each of the sensors 50 according to Example 1 and Example 2. FIG. 6 shows an instance of additionally providing one intermediate electrode according to Example 3.

In the sensor 50A according to Example 3, an intermediate electrode 64 having a predetermined impurity ion concentration, having a thickness of about 300 nm, and made of polysilicon is formed in the insulating film 54 between the lower electrode 53 and the upper electrode 55. A voltmeter 66 is connected to the intermediate electrode 64 by a wiring 65, and connected to a terminal 67 having a reference potential (e.g., ground potential).

Charge-up occurs onto the inner walls of the contact holes 56 by the plasma 32. Due to this, if the contact holes 56 are formed in an LSI product or the like by plasma etching, a phenomenon occurs that positive ions h accelerating etching are influenced by the potential of the inner walls of the contact holes 56 so that a path of the positive ions h is curved in a direction of the bottoms of the contact holes 56 and the positive ions h strike against the inner walls of the contact holes 56, and that the inner walls are etched. If the inner walls of the contact holes 56 are conspicuously etched, problems such as a reduction in product yield occur. Since the potential of the inner walls of the contact holes 56 has an influence on the path of the positive ions h from the plasma 32, the potential of the inner walls of the contact holes 56 between the upper electrode 55 and the lower electrode 53 may be measured by providing the intermediate electrode 64 and the charge-up in the contact holes 56 may be examined in more detail.

If two or more intermediate electrodes 64 are provided, the intermediate electrodes 64 may be provided at positions set by dividing equally, e.g., trisecting or quadrisecting the interval between the upper electrode 55 and the lower electrode 53, respectively or at positions between the upper electrode 55 and the lower electrode 53 at which positions the potential is to be measured, respectively.

Modifications

The invention is not limited to Example 1 to Example 3. Various modifications may be made of the invention and the invention may be carried out in various types of use. Examples of the types of use and modifications include (i) to (iv) as follows.

(i) In the invention, the configurations, manufacturing methods and the like of the plasma processing apparatus 30 and the sensors 50 and 50A shown in the drawings may be changed.

(ii) In FIG. 2, the two sensors 50-1 and 50-2 are provided on the surface of the wafer 40. Alternatively, one sensor 50-1 may be provided on the surface of the wafer 40 or near the wafer 40 (e.g., on the outer circumference of the stage 33) depending on usage. Likewise, in FIGS. 5A and 5B, plural sensors 50 is provided respectively on the surface of each of the wafers 40-1 and 40-2. Alternatively, one sensor 50-1 may be provided on the wafer 40-1 or 40-2 while changing the number of contact holes 56 formed in the sensors 50 and the plasma process may be monitored.

(iii) The plasma monitoring system shown in FIG. 2 includes the plasma processing apparatus 30. Alternatively, the plasma monitoring system may be configured to include the sensor 50 and the voltmeters 60 and 61 shown in FIG. 1 or to include the sensor-added wafer 40 to which one or more sensors 50 is attached and the voltmeters 60 and 61. At this time, if the voltmeters 60 and 61 are downsized and the downsized voltmeters 60 and 61 and the other circuit components (such as a driving battery and a data storage memory) are included in the sensor 50 or the sensor-added wafer 40, the plasma monitoring system may be downsized and user-friendliness of the plasma monitoring system is improved.

(iv) In Example 1 to Example 3, the semiconductor manufacturing process using plasma has been described. However, the invention is applicable to all the other manufacturing processes using plasma than the semiconductor manufacturing process, for example, to a flat panel manufacturing process.

As can be understood from the foregoing, according to the invention, the second electrode (upper electrode 55) and the first electrode (lower electrode 53) are provided on the surface of the actual contact hole pattern and the bottoms of the contact holes (56), respectively, and the potential of the surface of the contact hole pattern and the potential of the bottoms of the contact holes are measured simultaneously. Therefore, the charge-up occurring in the actual contact hole pattern may be observed as the potential difference between the second electrode and the first electrode. Besides, since the potential difference is measured during occurrence of the plasma (32), the charge-up may be observed at real time. Therefore the process conditions may be optimized and the reduction in yield caused by the charge-up may be suppressed.

Moreover, the potential of the second electrode has a correlation with the self-alignment bias measured on the plasma processing apparatus. Due to this, if sensors are arranged, for example, in a plurality portions in the plane of the wafer, respectively, the in-plane distribution of the self-alignment bias may be monitored indirectly.

What is claimed is:
1. A plasma monitoring method comprising:
   a first plasma processing including:
      preparing a first wafer to be monitored;
      arranging and bonding a plurality of sensors on the first wafer, each of the plurality of sensors comprising:
         a substrate;
         a first electrode formed on the substrate;

an insulating film that is formed on the first electrode and has a contact hole formed therein, the contact hole exposing a part of a surface of the first electrode; and a second electrode that is formed on the insulating film and is electrically separated from the first electrode;

positioning the first wafer in a space where plasma is generated during the first plasma processing; and monitoring the plasma by measuring
potentials of the first electrode and the second electrode of each of the sensors, or
a potential difference between the first electrode and the second electrode of each of the sensors during the first plasma processing to determine charge-up;

a second plasma processing that is performed before the first plasma processing or after the first plasma processing, the second plasma processing including:

preparing a second wafer to be monitored;

arranging and bonding a group of the sensors on the second wafer at a plurality of different positions on the second wafer, a total number of the group of the sensors arranged and bonded on the second wafer is different from a total number of the plurality of sensors arranged and bonded on the first wafer; and positioning the second wafer in a space where plasma is generated during the second plasma processing; and monitoring the plasma generated during the second plasma processing by measuring
potentials of the first electrode and the second electrode of each of the group of the sensors that are arranged and bonded on the second wafer, or
a potential difference between the first electrode and the second electrode of each of the group of the sensors that are arranged and bonded on the second wafer to determine charge-up; and determining a dependence of charge-up on a pattern-ratio by comparing charge-up changes during the first plasma processing and the second plasma processing.

2. The plasma monitoring method of claim 1, wherein a total area of the contact holes of the plurality of sensors arranged and bonded to the first wafer is different than a total area of the contact holes of the group of the sensors arranged and bonded to the second wafer.

3. The plasma monitoring method of claim 1, further comprising accommodating the first and second wafers within a plasma chamber.

4. The plasma monitoring method of claim 1, wherein each of the sensors of the plurality of sensors arranged and bonded to the first wafer has one or more third electrodes arranged between the first electrode and the second electrode and electrically isolated from the first electrode and the second electrode, and the method further comprises:

during the first plasma processing, for each of the respective sensors of the plurality of sensors arranged and bonded to the first wafer, measuring and monitoring at least one of potentials of the first, second and third electrodes of the respective sensor, or a potential difference among the first, second and third electrodes of the respective sensor; and during the second plasma processing, for each of the respective sensors of the group of the sensors arranged and bonded to the second wafer, measuring and monitoring at least one of potentials of the first, second and third electrodes of the respective sensor, or a potential difference among the first, second and third electrodes of the respective sensor.

5. The plasma monitoring method of claim 1, wherein each of the contact holes has a cross-section of a circle.

6. The plasma monitoring method of claim 1, wherein each of the plurality of sensors arranged and bonded to the first wafer further comprises a plurality of contact holes.

7. The plasma monitoring method of claim 1, wherein the first plasma processing includes modifying process conditions of the first plasma processing so as to suppress over-etching the contact holes of the plurality of sensors arranged and bonded to the first wafer during the first plasma processing.

8. The plasma monitoring method of claim 7, wherein the second plasma processing includes modifying process conditions of the second plasma processing so as to suppress over-etching the contact holes of the group of the sensors arranged and bonded to the second wafer during the second plasma processing.

9. The plasma monitoring method of claim 1, wherein in the first plasma processing, the monitoring the plasma includes measuring the potential difference between the first electrode and the second electrode of each of the plurality of sensors arranged and bonded to the first wafer during the first plasma processing to determine charge-up, and the monitoring the plasma generated during the second plasma processing includes measuring the potential difference between the first electrode and the second electrode of each of the group of the sensors that are arranged and bonded on the second wafer to determine charge-up.

10. The plasma monitoring method of claim 1, wherein the first plasma processing and the second plasma processing are performed in a same chamber.

* * * * *